(12) United States Patent
Ershov et al.

(10) Patent No.: US 7,598,509 B2
(45) Date of Patent: Oct. 6, 2009

(54) LASER PRODUCED PLASMA EUV LIGHT SOURCE

(75) Inventors: Alexander I. Ershov, San Diego, CA (US); William N. Partlo, Poway, CA (US); Norbert Bowering, San Diego, CA (US); Bjorn Hansson, La Jolla, CA (US)

(73) Assignee: Cymer, Inc., San Diego, CA (US)

( * ) Notice: Subject to any disclaimer, the term of this patent is extended or adjusted under 35 U.S.C. 154(b) by 445 days.

(21) Appl. No.: 11/358,992

(22) Filed: Feb. 21, 2006

(65) Prior Publication Data

US 2006/0219957 A1 Oct. 5, 2006

Related U.S. Application Data

(63) Continuation-in-part of application No. 11/174,442, filed on Jun. 29, 2005, now Pat. No. 7,196,342, which is a continuation-in-part of application No. 10/979,945, filed on Nov. 1, 2004, now abandoned, and a continuation-in-part of application No. 11/067,099, filed on Feb. 25, 2005, now Pat. No. 7,109,503.

(51) Int. Cl.
  *G01J 3/10* (2006.01)
(52) U.S. Cl. .................. 250/504 R; 250/492.2
(58) Field of Classification Search ............ 250/504 R, 250/492.2
  See application file for complete search history.

(56) References Cited

U.S. PATENT DOCUMENTS

| | | | |
|---|---|---|---|
| 2,759,106 A | 8/1956 | Wolter | 250/50 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |

(Continued)

FOREIGN PATENT DOCUMENTS

JP  06-053594  2/1994

(Continued)

OTHER PUBLICATIONS

U.S. Appl. No. 11/358,983, filed Feb. 21, 2006, Bykanov et al.

(Continued)

*Primary Examiner*—Nikita Wells
*Assistant Examiner*—Johnnie L Smith, II
(74) *Attorney, Agent, or Firm*—Matthew K. Hillman

(57) ABSTRACT

An EUV light source is disclosed that may include a laser source, e.g. $CO_2$ laser, a plasma chamber, and a beam delivery system for passing a laser beam from the laser source into the plasma chamber. Embodiments are disclosed which may include one or more of the following; a bypass line may be provided to establish fluid communication between the plasma chamber and the auxiliary chamber, a focusing optic, e.g. mirror, for focusing the laser beam to a focal spot in the plasma chamber, a steering optic for steering the laser beam focal spot in the plasma chamber, and an optical arrangement for adjusting focal power.

50 Claims, 4 Drawing Sheets

U.S. PATENT DOCUMENTS

| | | | |
|---|---|---|---|
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,223,279 A | 9/1980 | Bradford, Jr. et al. | 331/94.5 |
| 4,364,342 A | 12/1982 | Asik | 123/143 |
| 4,369,758 A | 1/1983 | Endo | 123/620 |
| 4,455,658 A | 6/1984 | Sutter et al. | 372/38 |
| 4,504,964 A | 3/1985 | Cartz et al. | 378/119 |
| 4,507,588 A | 3/1985 | Asmussen et al. | 315/39 |
| 4,534,035 A | 8/1985 | Long | 372/85 |
| 4,536,884 A | 8/1985 | Weiss et al. | 378/119 |
| 4,538,291 A | 8/1985 | Iwamatsu | 378/119 |
| 4,550,408 A | 10/1985 | Karning et al. | 372/58 |
| 4,561,406 A | 12/1985 | Ward | 123/536 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/74 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,774,914 A | 10/1988 | Ward | 123/162 |
| 4,837,794 A | 6/1989 | Riordan et al. | 378/119 |
| 4,891,820 A | 1/1990 | Rando et al. | 372/93 |
| 4,928,020 A | 5/1990 | Birx et al. | 307/106 |
| 4,959,840 A | 9/1990 | Akins et al. | 372/57 |
| 5,005,180 A | 4/1991 | Edelman et al. | 372/57 |
| 5,023,884 A | 6/1991 | Akins et al. | 372/57 |
| 5,023,897 A | 6/1991 | Neff et al. | 378/122 |
| 5,025,445 A | 6/1991 | Anderson et al. | 372/20 |
| 5,025,446 A | 6/1991 | Kuizenga | 372/21 |
| 5,027,076 A | 6/1991 | Horsley et al. | 324/674 |
| 5,070,513 A | 12/1991 | Letardi | 372/83 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,175,755 A | 12/1992 | Kumakhov | 378/34 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,319,695 A | 6/1994 | Itoh et al. | 378/84 |
| 5,359,620 A | 10/1994 | Akins | 372/58 |
| RE34,806 E | 12/1994 | Cann | 427/446 |
| 5,411,224 A | 5/1995 | Dearman et al. | 244/53 |
| 5,448,580 A | 9/1995 | Birx et al. | 372/38 |
| 5,471,965 A | 12/1995 | Kapich | 123/565 |
| 5,504,795 A | 4/1996 | McGeoch | 378/119 |
| 5,729,562 A | 3/1998 | Birx et al. | 372/38 |
| 5,763,930 A | 6/1998 | Partlo | 250/504 |
| 5,852,621 A | 12/1998 | Sandstrom | 372/25 |
| 5,856,991 A | 1/1999 | Ershov | 372/57 |
| 5,863,017 A | 1/1999 | Larson et al. | 248/176.1 |
| 5,866,871 A | 2/1999 | Birx | 219/121 |
| 5,936,988 A | 8/1999 | Partlo et al. | 372/38 |
| 5,953,360 A | 9/1999 | Vitruk et al. | 372/87 |
| 5,963,616 A | 10/1999 | Silfvast et al. | 378/122 |
| 5,970,076 A | 10/1999 | Hamada | 372/20 |
| 5,978,394 A | 11/1999 | Newman et al. | 372/32 |
| 5,991,324 A | 11/1999 | Knowles et al. | 372/57 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,031,241 A | 2/2000 | Silfvast et al. | 250/504 |
| 6,031,598 A | 2/2000 | Tichenor et al. | 355/67 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38.1 |
| 6,151,346 A | 11/2000 | Partlo et al. | 372/38 |
| 6,151,349 A | 11/2000 | Gong et al. | 372/58 |
| 6,164,116 A | 12/2000 | Rice et al. | 73/1.72 |
| 6,172,324 B1 | 1/2001 | Birx | 219/121.57 |
| 6,192,064 B1 | 2/2001 | Algots et al. | 372/99 |
| 6,195,272 B1 | 2/2001 | Pascente | 363/21 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,285,743 B1 | 9/2001 | Kondo et al. | 378/119 |
| 6,304,630 B1 | 10/2001 | Bisschops et al. | 378/119 |
| 6,307,913 B1 | 10/2001 | Foster et al. | 378/34 |
| 6,317,448 B1 | 11/2001 | Das et al. | 372/32 |
| 6,359,922 B1 | 3/2002 | Partlo et al. | 372/58 |
| 6,370,174 B1 | 4/2002 | Onkels et al. | 372/38.04 |
| 6,377,651 B1 | 4/2002 | Richardson et al. | 378/34 |
| 6,381,257 B1 | 4/2002 | Ershov et al. | 372/57 |
| 6,392,743 B1 | 5/2002 | Zambon et al. | 355/69 |
| 6,396,900 B1 | 5/2002 | Barbee, Jr. et al. | 378/84 |
| 6,404,784 B2 | 6/2002 | Komine | 372/9 |
| 6,414,979 B2 | 7/2002 | Ujazdowski et al. | 372/87 |
| 6,442,181 B1 | 8/2002 | Oliver et al. | 372/25 |
| 6,452,194 B2 | 9/2002 | Bijkerk et al. | 250/492.2 |
| 6,452,199 B1 | 9/2002 | Partlo et al. | 250/504 |
| 6,466,602 B1 | 10/2002 | Fleurov et al. | 372/87 |
| 6,477,193 B2 | 11/2002 | Oliver et al. | 372/58 |
| 6,493,374 B1 | 12/2002 | Fomenkov et al. | 372/102 |
| 6,493,423 B1 | 12/2002 | Bisschops | 378/119 |
| 6,529,531 B1 | 3/2003 | Everage et al. | 372/20 |
| 6,532,247 B2 | 3/2003 | Spangler et al. | 372/61 |
| 6,535,531 B1 | 3/2003 | Smith et al. | 372/25 |
| 6,538,257 B2 | 3/2003 | Bisschops | 250/493.1 |
| 6,538,737 B2 | 3/2003 | Sandstrom et al. | 356/334 |
| 6,541,786 B1 | 4/2003 | Partlo et al. | 250/504 |
| 6,549,551 B2 | 4/2003 | Ness et al. | 372/38.07 |
| 6,566,667 B1 | 5/2003 | Partlo et al. | 250/504 |
| 6,566,668 B2 | 5/2003 | Rauch et al. | 250/504 |
| 6,567,450 B2 | 5/2003 | Myers et al. | 372/55 |
| 6,576,912 B2 | 6/2003 | Visser et al. | 250/492.2 |
| 6,580,517 B2 | 6/2003 | Lokai et al. | 356/519 |
| 6,584,132 B2 | 6/2003 | Morton | 372/57 |
| 6,586,757 B2 | 7/2003 | Melnychuk et al. | 250/504 |
| 6,590,922 B2 | 7/2003 | Onkels et al. | 372/57 |
| 6,590,959 B2 | 7/2003 | Kandaka et al. | 378/119 |
| 6,618,421 B2 | 9/2003 | Das et al. | 372/58 |
| 6,621,846 B1 | 9/2003 | Sandstrom et al. | 372/57 |
| 6,625,191 B2 | 9/2003 | Knowles et al. | 372/55 |
| 6,647,086 B2 | 11/2003 | Amemiya et al. | 378/34 |
| 6,671,294 B2 | 12/2003 | Kroyan et al. | 372/20 |
| 6,721,340 B1 | 4/2004 | Fomenkov et al. | 372/25 |
| 6,744,060 B2 | 6/2004 | Ness et al. | 315/111.01 |
| 6,753,534 B2 | 6/2004 | Novak et al. | 250/442.11 |
| 6,757,316 B2 | 6/2004 | Newman et al. | 372/57 |
| 6,782,031 B2 | 8/2004 | Hofmann et al. | 372/90 |
| 6,795,474 B2 | 9/2004 | Partlo et al. | 372/57 |
| 6,804,327 B2 | 10/2004 | Schriever et al. | 378/119 |
| 6,815,700 B2 | 11/2004 | Melnychuk et al. | 250/504 |
| 6,822,251 B1 | 11/2004 | Arenberg et al. | 250/504 |
| 6,865,255 B2 | 3/2005 | Richardson | 378/119 |
| 6,891,172 B2* | 5/2005 | Ohgushi et al. | 250/492.2 |
| 6,894,298 B2 | 5/2005 | Ahmad et al. | 250/504 |
| 6,904,073 B2 | 6/2005 | Yager et al. | 372/57 |
| 6,985,508 B2 | 1/2006 | Knowles et al. | 372/55 |
| 7,247,870 B2* | 7/2007 | Ershov et al. | 250/504 R |
| 7,274,435 B2* | 9/2007 | Hiura et al. | 355/67 |
| 2002/0041368 A1 | 4/2002 | Ota et al. | 355/55 |
| 2002/0114370 A1 | 8/2002 | Onkels et al. | 372/55 |
| 2003/0184720 A1 | 10/2003 | Heerens et al. | 355/53 |
| 2003/0223528 A1 | 12/2003 | Petach et al. | 378/119 |
| 2004/0183038 A1 | 9/2004 | Hiramoto et al. | 250/504 |

| | | | |
|---|---|---|---|
| 2004/0209411 A1 | 10/2004 | Fisher et al. | 438/197 |
| 2005/0199829 A1 | 9/2005 | Partlo et al. | 250/400 |
| 2005/0205810 A1 | 9/2005 | Akins et al. | 250/504 |
| 2006/0131515 A1 | 6/2006 | Partlo et al. | 250/504 |
| 2007/0029512 A1* | 2/2007 | Bowering et al. | 250/504 R |
| 2008/0087847 A1* | 4/2008 | Bykanov et al. | 250/504 R |

FOREIGN PATENT DOCUMENTS

| | | |
|---|---|---|
| JP | 2000-058944 | 2/2000 |
| JP | 200091096 | 3/2000 |
| WO | WO2004/104707 A2 | 12/2004 |

OTHER PUBLICATIONS

U.S. Appl. No. 11/358,988, filed Feb. 21, 2006, Bykanov et al.
U.S. Appl. No. 60/775,442, filed Feb. 21, 2006, Bowering et al.
Andreev et al., "Enhancement of laser/EUV conversion by shaped laser pulse interacting with Li-contained targets for EUV lithography," Proc. of SPIE 5196:128-136 (2004).
Apruzese, "X-ray laser reearch using z pinches," Am. Inst. Of Phys. 399-403 (1994).
Bollanti et al., "Compact three electrodes excimer laser Ianus for a POPA optical system," SPIE Proc. (2206) 144-153 (1994).
Bollanti et al., "Ianus the three-electrode excimer laser," App. Phys. B (Lasers & Optics) 66(4):401-406, (1998).
Braun et al., "Multi-component EUV multiplayer Mirrors," Proc. SPIE, 5037:2-13 (2003).
Choi et al., "A $10^{13}$ A/s high energy density micro discharge radiation source," B. Radiation Characteristics, p. 287-290.
Choi et al., "Fast pulsed hollow cathode capillary discharge device," Rev. of Sci. Instrum. 69(9):3118-3122 (1998).
Choi et al., "Temporal development of hard and soft x-ray emission from a gas-puff Z pinch," Rev. Sci. Instrum. 57(8), pp. 2162-2164 (Aug. 1986).
Coutts et al., "High average power blue generation from a copper vapour laser pumped titanium sapphire laser", Journal of Modern Optics, vol. 45, No. 6, p. 1185-1197 (1998).
Eichler, et al., "Phase conjugation for realizing lasers with diffraction limited beam quality and high average power," Techninishe Universitat Berlin, Optisches Institut, (Jun. 1998).
Fedosejevs and A. A. Offenberger, "Subnanosecond pulses from a KrF Laser pumped $SF_6$ Brillouin Amplifier", IEEE J. QE 21, 1558-1562 (1985).
Feigl et al., "Heat resistance of EUV multiplayer mirrors for long-time applications," Microelectric Engineering, 57-58:3-8 (2001).
Fomenkov et al., "Characterization of a 13.5 nm source for EUV lithography based on a dense plasma focus and lithium emission," Sematech Intl. Workshop on EUV Lithography (Oct. 1999).
Giordano et al., "Magnetic pulse compressor for prepulse discharge in spiker-sustainer excitati technique for XeCl lasers," Rev. Sci. Instrum 65(8), pp. 2475-2481 (Aug. 1994).
Hansson et al., "Xenon liguid jet laser-plasma source for EUV lithography," Emerging Lithographic Technologies IV, Proc. of SPIE, vol. 3997:729-732 (2000).
Hercher, "Tunable single mode operation of gas lasers using intracavity tilted etalons," Applied Optics, vol. 8, No. 6, Jun. 1969, pp. 1103-1106.
Jahn, Physics of Electric Propulsion, McGraw-Hill Book Company, (Series in Missile and Space U.S.A.) Chap. 9, "Unsteady Electromagnetic Acceleration," p. 257 (1968).
Jiang, et al., "Compact multimode pumped erbium-doped phosphate fiber amplifiers," Optical Engineering, vol. 42, Issue 10, pp. 2817-2820 (Oct. 2003).
Kato, "Electrode Lifetimes in a plasma focus soft x-ray source," J. Appl. Phys. (33) Pt. 1, No. 8:4742-4744 (1991).
Kato et al., "Plasma focus x-ray source for lithography," Am. Vac. Sci. Tech. B. 6(1): 1950198 (1988).
K. Kuwahara et al., "Short-pulse generation by saturated KrF laser amplification of a steep Stokes pulse produced by two-step stimulated Brillouin scattering", J. Opt. Soc. Am. B 17, 1943-1947 (2000).
Lange, Michael R., et al., "High gain coefficient phosphate glass fiber amplifier," NFOEC 2003, paper No. 126.

Lebert et al., "Soft x-ray emission of laser-produced plasmas using a low-debris cryogenic nitrogen targer," J. App. Phys., 84(6):3419-3421 (1998).
Lebert et al., "A gas discharged based radiation source for EUV-lithography," Intl. Conf. Micro and Nano-Engineering 98 (Sep. 22-24, 1998) Leuven, Belgium.
Lebert et al., "Investigation of pinch plasmas with plasma parameters promising ASE," Inst. Phys. Conf. Ser No. 125 Section 9, pp. 411-415 (1992) Schiersee, Germany.
Lebert et al., "Comparison of laser produced and gas discharge based EUV sources for different applications," Intl. Conf. Micro- and Nano-Engineering 98 (Sep. 22-24, 1998) Leuven, Belgium.
Lee, "Production of dense plasmas in hypocycloidal pinch apparatus," The Phys. of Fluids, 20(2):313-321 (1977).
Lewis, "Status of collision-pumped x-ray lasers," Am. Inst. Phys. pp. 9-16 (1994).
Lowe, "Gas plasmas yield x-rays for lithography," Electronics, pp. 40-41 (Jan. 27, 1982).
Malmqvist et al., "Liquid-jet target for laser-plasma soft x-ray generation," Am. Inst. Phys. 67(12):4150-4153 (1996).
Mather, "Formation of a high-density deuterium plasma focus," The Physics of Fluids, 8(2), 366-377 (Feb. 1965).
Mather et al., "Stability of the dense plasma focus," Phys. of Fluids (12(11):2343-2347 (1969).
Matthews et al., "Plasma sources for x-ray lithography," SPIE 333 Submicron Lithography, pp. 136-139 (1982).
Maruyama et al., Characteristics of high-power excimer laser master oscillator power amplifier system for dye laser pumping, Optics Communications, vol. 87, No. 3 p. 105-108 (1992).
Mayo et al., "A magnetized coaxial source facility for the generation of energetic plasma flows," Sci. Technol. vol. 4, pp. 47-55 (1994).
Mayo et al., "Initial results on high enthalpy plasma generation in a magnetized coaxial source," Fusion Tech vol. 26:1221-1225 (1994).
Miballa et al., "Characterization of the Intermediate Focus", JENOPTIK Mikrotechnik GmbH, SEMATECH EUV Source Workshop, San Jose, CA (Feb. 27, 2004).
Nilsen et al., "Analysis of resonantly photopumped Na-Ne x-ray laser scheme," Am. Phys. Soc. 44(7):4591-4597 (1991).
Nishioka et al., "UV saturable absorber for short-pulse KrF laser systems", Opt. Lett. 14, 692-694 (1989).
Orme et al., "Electrostatic charging and deflection of nonconventional droplet streams formed from capillary stream breakup," Physics of Fluids, 12(9):2224-2235, (Sep. 2000).
Orme et al., "Charged molten droplet deposition as a direct write technology," MRS 2000 Spring Meeting, san Francisco, (Apr. 2000).
Pant et al., "Behavior of expanding laser produced plasma in a magnetic filed," Physica Scripta, T75:104-111, (1998).
Partlo et al., "EUV (13.5nm) light generation using a dense plasma focus device," SPIE Proc. on Emerging Lithographic Technologies III, vol. 3676, 846-858 (Mar. 1999).
Pearlman et al., "x-ray lithography using a pulsed plasma source," J. Vac. Sci. Technol., pp. 1190-1193 (Nov./Dec. 1981).
Porter et al., "Demonstration of population inversion by resonant photopumping in a neon gas cell irradiated by a sodium Z pinch," Phys. Rev. Let., 68(6): 796-799, (Feb. 1992).
Price, "X-ray microscopy using grazing incidence reflection optics," Am. Inst. Phys., pp. 189-199 (1981).
Qi et al., "Fluorescence in Mg IX emission at 48.340 Å from Mg pinch plasmas photopumped by Al XI line radiation at 48.338 Å," The Am. Phys. Soc., 47(3):2253-2263 (Mar. 1993).
Scheuer et al., "A magnetically-nozzled, quasi-steady, multimegawatt, coaxial plasma thruster," IEEE:Transactions on Plasma Science, 22(6) (Dec. 1994).
S. Schiemann et al., "Efficient temporal compression of coherent nanosecond pulses in a compact SBS generator-amplifier setup", IEEE J. QE 33, 358-366 (1997).
Schriever et al., "Laser-produced lithium plasma as a narrow-band extended ultraviolet radiation source for photoelectron spectroscopy," App. Optics, 37(7):1243-1248, (Mar. 1998).
Schriever et al., "Narrowband laser produced extreme ultraviolet sources adapted to silicon/molybdenum multiplayer optics," J. of App. Phys., 83(9):4566-4571, (May 1998).

Shiloh et al., "Z pinch of a gas jet," Physical Review Lett., 40(8), pp. 515-518 (Feb. 20, 1978).

Silfvast et al., "High-power plasma discharge source at 13.5 nm and 11.4 nm for EUV lithography," SPIE, vol. 3676:272-275 (Mar. 1999).

Silfvast et al., "Lithium hydride capillary discharge creates x-ray plasma at 13.5 nanometers," Laser Focus World, p. 13 (Mar. 1997).

Stallings et al., "Imploding argon plasma experiments," Appl. Phys. Lett., 35(7), pp. 524-526 (Oct. 1, 1979).

Takahashi, E., et al., "KrF laser picosecond pulse source by stimulated scattering processes", Opt. Commun. 215, 163-167 (2003).

Takahashi, E., et al., "High-intensity short KrF laser-pulse generation by saturated amplification of truncated leading-edge pulse", Opt. Commun. 185, 431-437 (2000)q.

Tada et al., "1-pm spectrally narrowed compact ArF excimer laser for microlithography", Laser and Electro-Optics, CLEO '96, CThG4, p. 374 (1996).

Tillack et al., "Magnetic confinement of an expanding laser-produced plasma," UC San Diego, Center for Energy Research, UCSD Report & Abramova—Tornado Trap.

Wilhein et al., "A slit grating spectrograph for quantitative soft x-ray spectroscopy," Am. Inst of Phys. Rev. of Sci. Instrum., 70(3):1694-1699, (Mar. 1999).

Wu et al., "The vacuum spark and spherical pinch x-ray/EUV point sources," SPIE, Conf. on Emerging Tech. III, Santa Clara, CA vol. 3676:410-420, (Mar. 1999).

Yusheng et al., "Recent progress of "Heaven-One" high power KrF excimer laser system", Laser and Electro-Optics, CLEO '96, CThG4, p. 374 (1996).

Zombeck, "Astrophysical observations with high resolution x-ray telescope," Am. Inst. Of Phys. pp. 200-209, (1981).

International Search Report, Application No. PCT/US 06/06410, dated Sep. 11, 2007.

\* cited by examiner

LASER PRODUCED PLASMA EUV LIGHT SOURCE

CROSS-REFERENCE TO RELATED APPLICATIONS

The present application is a continuation-in-part application of U.S. patent application Ser. No. 11/174,442, entitled SYSTEMS AND METHODS FOR REDUCING THE INFLUENCE OF PLASMA-GENERATED DEBRIS ON THE INTERNAL COMPONENTS OF AN EUV LIGHT SOURCE, filed on Jun. 29, 2005, which is a continuation-in-part application of U.S. patent application Ser. No. 10/979,945, entitled LPP EUV LIGHT SOURCE, filed on Nov. 1, 2004, the disclosures of each of which are hereby incorporated by reference herein.

The present application is also a continuation-in-part application of U.S. patent application Ser. No. 11/067,099, entitled SYSTEMS FOR PROTECTING COMPONENTS OF AN EUV LIGHT SOURCE FROM PLASMA-GENERATED DEBRIS, filed on Feb. 25, 2005, the disclosure of which is hereby incorporated by reference herein.

The present invention is also related to U.S. patent application Ser. No. 10/900,839, entitled EUV LIGHT SOURCE, filed on Jul. 27, 2004, U.S. patent application Ser. No. 10/803,526, entitled HIGH REPETITION RATE LPP EUV LIGHT SOURCE, filed on Mar. 17, 2004, and U.S. patent application Ser. No. 10/798,740, entitled COLLECTOR FOR EUV LIGHT, filed on Mar. 10, 2004, the disclosures of each of which are hereby incorporated by reference herein.

The present application is also related to co-pending U.S. non-provisional patent application entitled LASER PRODUCED PLASMA EUV LIGHT SOURCE WITH PRE-PULSE filed concurrently herewith, Ser. No. 11/358,988, the entire contents of which are hereby incorporated by reference herein.

The present application is also related to co-pending U.S. nonprovisional patent application entitled SOURCE MATERIAL DISPENSER FOR EUV LIGHT SOURCE filed concurrently herewith, Ser. No. 11/358,983, the entire contents of which are hereby incorporated by reference herein.

The present application is also related to co-pending U.S. provisional patent application entitled EXTREME ULTRAVIOLET LIGHT SOURCE filed concurrently herewith, No. 60/775,442, the entire contents of which are hereby incorporated by reference herein.

FIELD OF THE INVENTION

The present invention relates to extreme ultraviolet ("EUV") light sources which provide EUV light from a plasma that is created from a source material and collected and directed to a focus for utilization outside of the EUV light source chamber, e.g., for semiconductor integrated circuit manufacturing photolithography e.g., at wavelengths of around 50 nm and below.

BACKGROUND OF THE INVENTION

Extreme ultraviolet ("EUV") light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP") the required plasma can be produced by irradiating a target material, such as a droplet, stream or cluster of material having the required line-emitting element, with a laser beam.

For this process, the plasma is typically produced in a sealed vessel, e.g., vacuum chamber, and monitored using various types of metrology equipment. In addition to generating EUV radiation, these plasma processes also typically generate undesirable by-products in the plasma chamber which can include heat, high energy ions and scattered debris from the plasma formation, e.g., atoms and/or clumps/microdroplets of source material that is not fully ionized in the plasma formation process.

These plasma formation by-products can potentially damage or reduce the operational efficiency of the various plasma chamber optical elements including, but not limited to, collector mirrors including multi-layer mirrors (MLM's) capable of EUV reflection at normal incidence and/or grazing incidence, the surfaces of metrology detectors, windows used to image the plasma formation process, and the laser input window. The heat, high energy ions and/or source material debris may be damaging to the optical elements in a number of ways, including heating them, coating them with materials which reduce light transmission, penetrating into them and, e.g., damaging structural integrity and/or optical properties, e.g., the ability of a mirror to reflect light at such short wavelengths, corroding or eroding them and/or diffusing into them. For some source materials, e.g. tin, it may be desirable to introduce an etchant, e.g. HBr into the plasma chamber to etch debris that deposits on the optical elements. It is further contemplated that the affected surfaces of the elements may be heated to increase the reaction rate of the etchant.

In addition, some optical elements, e.g., the laser input window, form a part of the vacuum chamber, and heretofore, have typically been placed under a considerable stress due to a pressure differential between the relatively high vacuum in the plasma chamber and the pressure, e.g. atmospheric pressure, outside the plasma chamber. For these elements, deposits and heat can combine to fracture (i.e., crack) the element resulting in a loss of vacuum and requiring a costly repair. To accommodate this stress and prevent fracture, laser input windows have generally been rather thick, and, as a consequence, are subject to thermal lensing. This thermal lensing, in turn, can reduce the ability to properly steer and focus a laser beam to a desired location within the plasma chamber. For example, for use in some LPP EUV light sources, it is contemplated that a laser beam be focused to a spot diameter of about 300 µm or less.

In addition to reducing problems associated with thermal lensing, a laser beam delivery system for an EUV light source may have components that are exposed to the plasma chamber environment. These components may include the laser input window and in some cases focusing and/or steering optics. For these components, it may be desirable to use materials that are compatible with the etchant and heat used in debris mitigation.

With the above in mind, Applicants disclose systems and methods for effectively delivering and focusing a laser beam to a selected location in an EUV light source.

SUMMARY OF THE INVENTION

An EUV light source is disclosed that may include a laser source, e.g. $CO_2$ laser, a plasma chamber, and a beam delivery system having at least one auxiliary chamber. The auxiliary chamber may have an input window for passing a laser beam from the laser source into the auxiliary chamber and an exit window for passing the laser beam into the plasma chamber.

In one embodiment, a bypass line may be provided to establish fluid communication between the plasma chamber and the auxiliary chamber. A valve may be provided to close the bypass line. In a particular embodiment, a focusing optic, e.g. mirror, may be disposed in the auxiliary chamber for focusing the laser beam to a focal spot in the plasma chamber. In another embodiment, the focusing optic, e.g. mirror, may be disposed in the plasma chamber.

In another aspect, a focusing optic that is moveable to selectively move the location of the focal spot may be provided. In one embodiment, a target delivery system, e.g. droplet generator, may be provided for delivering a plasma source material to a plasma formation site in the plasma chamber together with a target position detector for generating a signal indicative of target position. With this arrangement, the focusing optic may be moveable in response to the signal from the target position detector to locate the focal spot along a target trajectory.

In still another aspect of an embodiment, a steering optic, e.g. flat mirror mounted on a tip-tilt actuator, may be provided for steering the laser beam focal spot in the plasma chamber. In a particular embodiment, the steering optic and focusing optic may be moveable together in a first direction to move the focal spot along a path parallel to the first direction. Like the focusing optic, the steering optic may be moveable in response to a signal from as target position detector to locate the focal spot along a target trajectory. An optical assembly, e.g. z-fold telescope, may be provided to adjust focal power.

For one or more of the above described embodiments, a plasma may be created in the plasma chamber comprising a plasma formation material, e.g. Sn, and an etchant for the plasma formation material, e.g. HBr, HI, $Br_2$, $Cl_2$, HCl, $H_2$ or combinations thereof, may be introduced into the plasma chamber. In a particular embodiment, a heating subsystem may be provided to heat deposited plasma formation material on the exit window to a temperature greater than 150° C. to increase a rate of a chemical reaction between deposited plasma formation material and the etchant.

In one aspect, an EUV light source may include a laser source having a discharge chamber operating at a discharge pressure, e.g. $CO_2$ laser, a plasma chamber, and a beam delivery system having at least one auxiliary chamber. The auxiliary chamber may have an input window for passing a laser beam from the laser source into the auxiliary chamber and an exit window for passing the laser beam into the plasma chamber. For this aspect, the light source may further include a bypass line establishing fluid communication between the discharge chamber and the auxiliary chamber. A valve operable to close the bypass line may be provided. In one particular embodiment, the auxiliary chamber may include a first compartment, a second compartment, and a sealing assembly for reconfiguring the auxiliary chamber between a first configuration wherein the first compartment is in fluid communication with the second compartment and a second configuration wherein the first compartment is sealed from the second compartment. For example, a window may be disposed in the auxiliary chamber that is moveable between a first position wherein the first compartment is in fluid communication with the second compartment and a second position wherein the first compartment is sealed from the second compartment.

In another aspect, a light source that produces EUV by plasma formation and generates debris may include a plasma chamber, a $CO_2$ laser source producing a laser beam having a wavelength, $\lambda$, e.g. about 10.6 µm, and a laser input window for the plasma chamber. The light source may introduce an etchant, e.g. HBr, HI, $Br_2$, $Cl_2$, HCl, $H_2$ or a combination thereof, for the plasma formation material, e.g. Sn, into the plasma chamber and a subsystem may be provided for heating deposited plasma formation material on the window to an elevated temperature, t, e.g., a temperature greater than about 150° C., to increase a rate of a chemical reaction between deposited plasma formation material and the etchant. For this aspect, the window provided may be substantially transparent to light at the wavelength, $\lambda$, and the window may have a surface that is chemically stable when exposed to the etchant at the temperature, t. In one embodiment, the window may be made of a material such as KBr, CsBr or CsI. In another embodiment, the window may be made by coating a material with KBr, CsBr or CsI. In a particular embodiment, a coating system to coat the window with a material selected from the group of materials consisting of KBr, CsBr and CsI after the window may be installed in the plasma chamber.

DETAILED DESCRIPTION OF PREFERRED EMBODIMENTS

Figure 1:
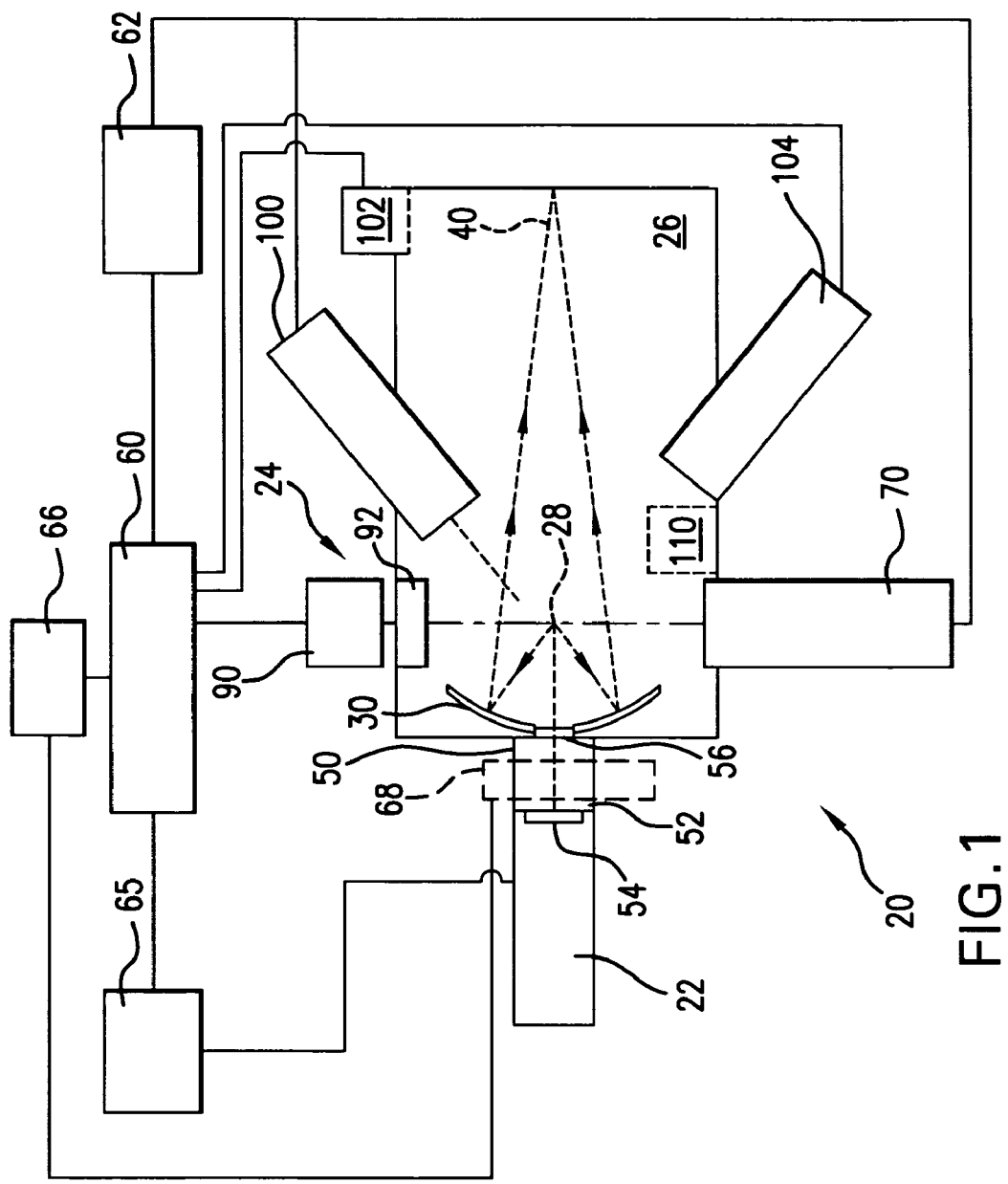
FIG. 1 shows a schematic view of an overall broad conception for a laser-produced plasma EUV light source according to an aspect of the present invention.

With initial reference to FIG. 1 there is shown a schematic view of an exemplary EUV light source, e.g., a laser produced plasma EUV light source 20 according to an aspect of the present invention. As shown, the LPP light source 20 may contain a pulsed or continuous laser system 22, e.g., a pulsed gas discharge $CO_2$, excimer or molecular fluorine laser operating at high power and high pulse repetition rate. Depending on the application, other types of lasers may also be suitable. For example, a solid state laser, a MOPA configured excimer laser system, e.g., as shown in U.S. Pat. Nos. 6,625,191, 6,549,551, and 6,567,450, an excimer laser having a single chamber, an excimer laser having more than two chambers, e.g., an oscillator chamber and two amplifying chambers (with the amplifying chambers in parallel or in series), a master oscillator/power oscillator (MOPO) arrangement, a power oscillator/power amplifier (POPA) arrangement, or a solid state laser that seeds one or more $CO_2$, excimer or molecular fluorine amplifier or oscillator chambers, may be suitable. Other designs are possible.

The light source 20 may also include a target delivery system 24, e.g., delivering targets, e.g. targets of a source material including tin, lithium, xenon or combinations thereof, in the form of liquid droplets, a liquid stream, solid particles or clusters, solid particles contained within liquid droplets or solid particles contained within a liquid stream. The targets may be delivered by the target delivery system 24, e.g., into the interior of a chamber 26 to an irradiation site 28 where the target will be irradiated and produce a plasma.

A beam delivery system 50 having an auxiliary chamber 52 may be provided to deliver a laser beam from the laser source 22, e.g. a beam of laser pulses, along a laser optical axis into the plasma chamber 26 to the irradiation site 28. At the irradiation site, the laser, suitably focused, may be used to create a plasma having certain characteristics which depend on the source material of the target. These characteristics may include the wavelength of the EUV light produced by the plasma and the type and amount of debris released from the plasma. As shown, the beam deliver system 50 may have an input window 54 for passing a laser beam from the laser source 22 into the auxiliary chamber 52 and an exit window 56 for passing the laser beam into the plasma chamber 26.

Continuing with FIG. 1, the light source 20 may also include a collector 30, e.g., a reflector, e.g., in the form of a truncated ellipse, with an aperture to allow the laser light to pass through and reach the irradiation site 28. The collector 30 may be, e.g., an elliptical mirror that has a first focus at the irradiation site 28 and a second focus at a so-called intermediate point 40 (also called the intermediate focus 40) where the EUV light may be output from the light source 20 and input to, e.g., an integrated circuit lithography tool (not shown).

The light source 20 may also include an EUV light source controller system 60, which may also include, e.g., a target position detection feedback system 62 and a laser firing control system 65, along with, e.g., a laser beam positioning system controller 66. The light source 20 may also include a target position detection system which may include one or more droplet imagers 70 that provide an output indicative of the position of a target droplet, e.g., relative to the irradiation site 28 and provide this output to the target position detection feedback system 62, which can, e.g., compute a target position and trajectory, from which a target error can be computed, if not on a droplet by droplet basis then on average. The target error may then be provided as an input to the light source controller 60, which can, e.g., provide a laser position, direction and timing correction signal, e.g., to the laser beam positioning controller 66 that the laser beam positioning system can use, e.g., to control the laser timing circuit and/or to control a laser beam position and shaping system 68, e.g., to change the location and/or focal power of the laser beam focal spot within the chamber 26.

As shown in FIG. 1, the light source 20 may include a target delivery control system 90, operable in response to a signal from the system controller 60 to e.g., modify the release point of the target droplets as released by the target delivery mechanism 92 to correct for errors in the target droplets arriving at the desired irradiation site 28. An EUV light source detector 100 may be provided to measure one or more EUV light parameters, including but not limited to, pulse energy, energy distribution as a function of wavelength, energy within a particular band of wavelengths, energy outside of a particular band of wavelengths and/or average power, and generate a feedback signal for use by the system controller 60 that can be, e.g., indicative of the errors in such things as the timing and focus of the laser pulses to properly intercept the target droplets in the right place and time for effective and efficient EUV light production. Although the detector 100 is shown positioned to receive light directly from the irradiation site 28, it is to be appreciated the detector could also be positioned to sample light at or downstream of the intermediate focus 40.

For the light source 20 shown in FIG. 1, irradiation of the source material targets may generate a plasma, and in some cases, debris may be generated at the irradiation site 28 which may contaminate the surfaces of optical elements including but not limited to the laser input window 56. As shown, a source 102 of a gaseous etchant capable of reaction with the source material may be introduced into the chamber 26 to clean contaminants surfaces of optical elements. For example, an HBr concentration of a few Torr can be used. In one application, the source material may include Sn and the etchant may be HBr, $Br_2$, $Cl_2$, HCl, $H_2$, $HCF_3$ or a combination thereof.

Continuing with FIG. 1, the EUV light source 20 may include one or more heater(s) 104 to initiate and/or increase a rate of a chemical reaction between deposited source material and the etchant on a surface of an optical element. For example, for a Sn source material and HBr etchant, the heater 104 may heat the contaminated surface of an optical element, e.g. laser input window 56, to a temperature in the range of 150 to 400° C., and for some applications greater than 400° C. For a plasma source material which comprises Li, the heater 104 may be designed to heat the surface or one or more optical elements to a temperature in the range of about 400 to 550° C. to vaporize Li from the surface (i.e. without necessarily using an etchant). Types of heaters which may be suitable include, but are not necessarily limited to radiative heaters, microwave heaters, RF heaters, ohmic heaters and combinations thereof. The heater(s) may be directed to a specific optical element surface, and thus be directional, or may be nondirectional and heat the entire chamber or substantial portions thereof.

Figure 2:
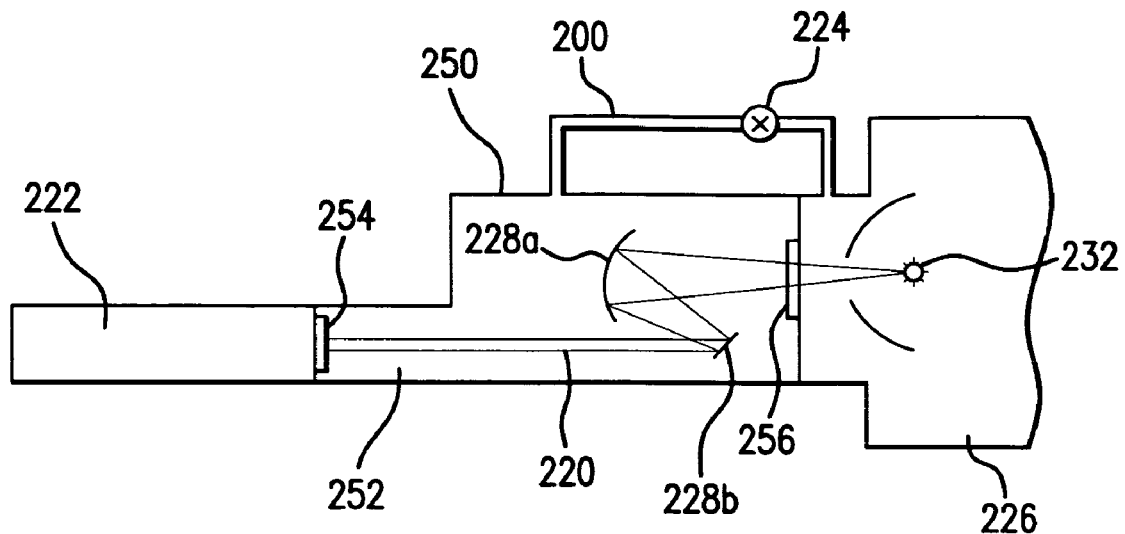
FIG. 2 shows a schematic, sectional view of an aspect of an embodiment wherein a beam delivery system is provided to deliver a laser beam into an EUV plasma chamber.

FIG. 2 shows an aspect of an embodiment wherein a beam delivery system 250 is provided to deliver a laser beam into an EUV plasma chamber 226. As shown, the beam delivery system 250 may establish an auxiliary chamber 252 which has an input window 254, which may be for example a gas discharge laser output window, for passing a laser beam 220 from the laser source 222 into the auxiliary chamber 252. The system 250 may also include an exit window 256 for passing the laser beam from the auxiliary chamber 226 into the plasma chamber 226.

For the embodiment shown in FIG. 2, a bypass line 200 establishes fluid communication between the plasma chamber 226 and the auxiliary chamber 252. With this arrangement, a substantially same pressure (e.g. a pressure differential of less than about 0.1 atm) may be provided in both chambers 226, 252. With this low pressure differential across the window 256, a relatively thin window may be employed, which in turn, may result in reduced thermal lensing as compared to a thicker window. FIG. 2 also shows that a valve 224 (controllable manually or automatically) may be provided to close the bypass line 200. With this arrangement, the valve 224 can be closed to allow one of the chambers 226, 252 to be accessed or otherwise operated on while maintaining the vacuum state of the other chamber 226, 252. Continuing with FIG. 2, it can be seen that a focusing optic, which for the embodiment shown is a pair of mirrors 228a, 228b, may be disposed in the auxiliary chamber 252 for focusing the laser beam 220 to a focal spot 232 in the plasma chamber 226.

Figure 3:
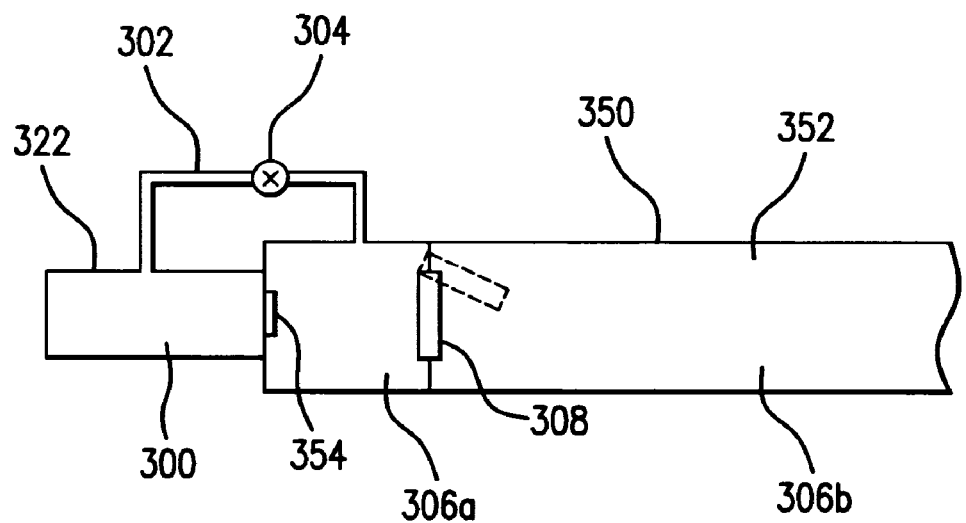
FIG. 3 shows a schematic, sectional view of another aspect of an embodiment wherein a chamber of a beam delivery system is maintained at a same pressure as a discharge chamber of an LPP laser source.

FIG. 3 illustrates another aspect of an embodiment wherein a chamber 352 of a beam delivery system 350 may be maintained at a substantially same pressure (e.g. a pressure differential of less than about 0.1 atm) as a discharge chamber 300 of a Laser-Produced-Plasma (LPP) laser source 322. For example, a $CO_2$ discharge laser may have a discharge chamber pressure of about 0.1 to 0.3 atm, and thus, for the embodiment shown in FIG. 3, the beam delivery system chamber 352 may be maintained at or near this pressure during operation of the EUV light source. In greater structural detail, the auxiliary chamber 352 may have an input window 354 for passing a laser beam (not shown) from the laser source 322 into the auxiliary chamber 352 and a bypass line 302 establishing fluid communication between the discharge chamber 300 and the auxiliary chamber 352. FIG. 3 also shows that a valve 304 (controllable manually or automatically) may be provided to close the bypass line 302. With this arrangement, the valve 304 can be closed to allow one of the chambers 300, 352 to be accessed or otherwise operated on while maintaining the vacuum state of the other chamber 300, 352.

FIG. 3 also illustrates that the auxiliary chamber 352 may include a first compartment 306a, a second compartment 306b, and a sealing assembly, which for the embodiment shown is a moveable window 308, for reconfiguring the auxiliary chamber 352 between a first configuration wherein the first compartment 306a is in fluid communication with the second compartment 306b and a second configuration wherein the first compartment 306a is sealed from the second compartment 306b. More specifically, as shown, window 308 may be disposed in the auxiliary chamber 308 and hinged for movement from a first window position (illustrated by the dash lines) wherein the first compartment 306a is in fluid communication with the second compartment 306b and a second window position (illustrated by the solid lines) wherein the first compartment 306a is sealed from the second compartment 306b. With this arrangement, the relatively thin input window 354 may be protected against pressure differentials, which may fracture the window 354. In one setup, pressure measurements in the chamber compartments 306a, 306b may be taken and used to automatically control the position of the moveable window 308 (e.g. window 308 is only moveable into the first window position when a substantially same pressure is present in the compartments 306a, 306b.

Figure 4:
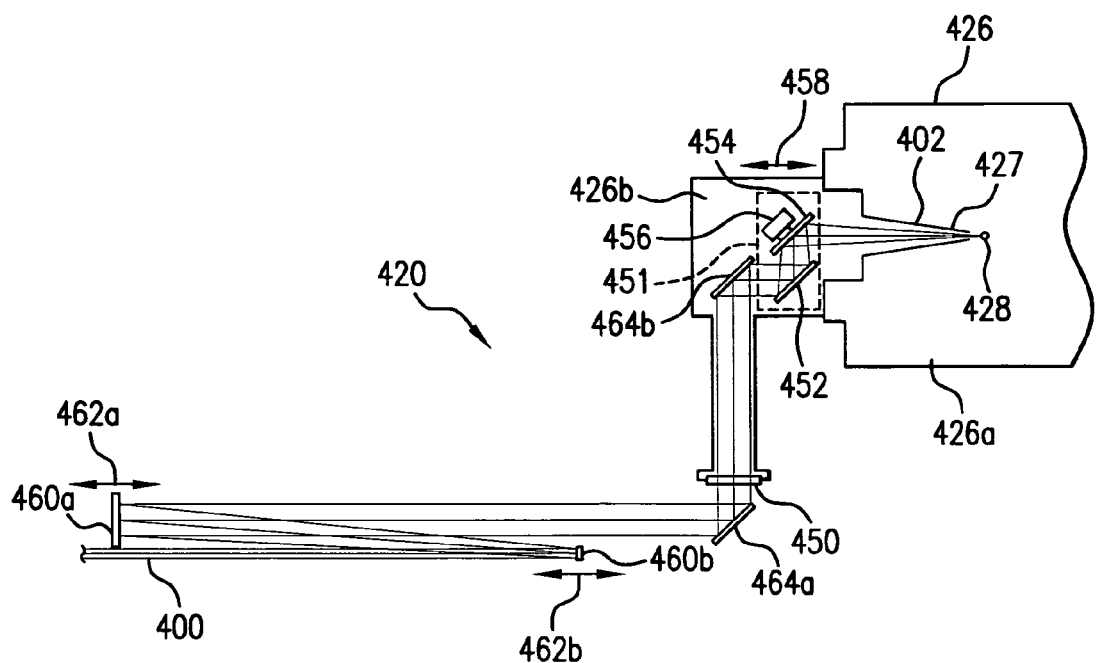
FIG. 4 shows a schematic, sectional view of an aspect of an embodiment wherein a beam delivery system is provided to deliver a laser beam into an EUV plasma chamber, the beam delivery system including a focusing optic, a steering optic, and an optical assembly to adjust focal power.

FIG. 4 shows an aspect of an embodiment wherein a beam delivery system is provided to focus and steer a laser beam 400 to a focal spot at a desired location in an EUV plasma chamber. As shown there, the light source 420 may include a conical shroud 402 (i.e. a so-called gas cone) that is positioned in the chamber 426 which separates the chamber 426 into two compartments 426a, 426b while maintaining fluid communication between the compartments 426a,b. In one aspect, the shroud 402 may limit (e.g. block) plasma-generated debris from reaching compartment 426b. In some implementations, a gaseous etchant, e.g. HBr, etc., may be introduced into the shroud 402 and flow out of the shroud 402 through the open end 427. Thus, etchant flow may be directed toward the irradiation site, as shown. In one implementation, a gas pressure, e.g. from a gaseous etchant, in compartment 426b may be maintained slightly higher than the gas pressure in compartment 426a to maintain a flow of gas toward the irradiation site.

Continuing with FIG. 4, laser input window 450 seals chamber 426 while allowing laser beam 400 to enter. The hollow shroud 402 allows the laser beam 400 to pass through the shroud 402 and reach the irradiation site. FIG. 4 also shows that a focus and steering assembly 451 is disposed in the compartment 426a of the chamber 426 and includes a focusing optic which may include one or more mirrors, prisms, lenses, etc arranged to focus a light beam to a focal spot. For the embodiment shown, a mirror 452, which may be an off-axis parabolic mirror, is used to focus the beam 400 to a focal spot at the desired irradiation site 428. The focus and steering assembly 451 also includes a steering optic, which may include one or more mirrors, prisms, lenses, etc. arranged to steer the focal spot established by the focusing optic to a desired location in the plasma chamber 426. For the embodiment shown, the steering optic includes a flat mirror 454 mounted on a tip-tilt actuator 456 which may move the mirror 454 independently in two dimensions. In addition to the two-dimensional movement of the focal spot afforded by the tip-tilt actuator 456, movement of the focal spot in the direction of arrow 458 may be obtained by the selected movement of the focus and steering assembly 451 parallel to the direction indicated by arrow 458. Thus, the steering optic and focusing optic may be moveable together to move the focal spot along a path parallel to arrow 458.

FIG. 4 also shows that the light source 420 may include an optical assembly having one or more mirrors, prisms, lenses, etc. arranged to adjust focal power. For the particular embodiment shown in FIG. 4, the assembly includes two spherical mirrors 460a,b that are disposed outside the chamber 426 in an optical arrangement commonly known as a z-fold telescope. As FIG. 4 illustrates, one or both of the mirrors 460a,b can be selectively moved parallel to respective direction arrows 462a,b to adjust focal power.

FIG. 4 also shows that two turning mirrors 464a,b are provided to direct the light beam 400 from the z-fold telescope arrangement to the focusing mirror 452. With the arrangement shown in FIG. 4, the turning mirror 464a is disposed outside the chamber 426 while the turning mirror 464b is disposed inside the chamber 426. Notwithstanding the use of the shroud 402 to limit the presence of plasma-generated debris in compartment 426b of chamber 426, it is contemplated that debris mitigation techniques may be employed in compartment 426b to maintain the surfaces of optical components in compartment 426b free of debris. For example, the use of an etchant, e.g. HBr with optical components 454, 452, 464b kept at elevated temperatures may be used. Another feature of the arrangement shown in FIG. 4 is the placement of the laser input window 450. As shown, the window is position such that it is not in direct "line of sight" with the irradiation site where plasma generated debris originates. In addition, the window 450 is positioned at a relatively large distance from the irradiation site, and, in some cases may exposed to a lower temperature (as compared to a closer window) and less debris.

Figure 5:
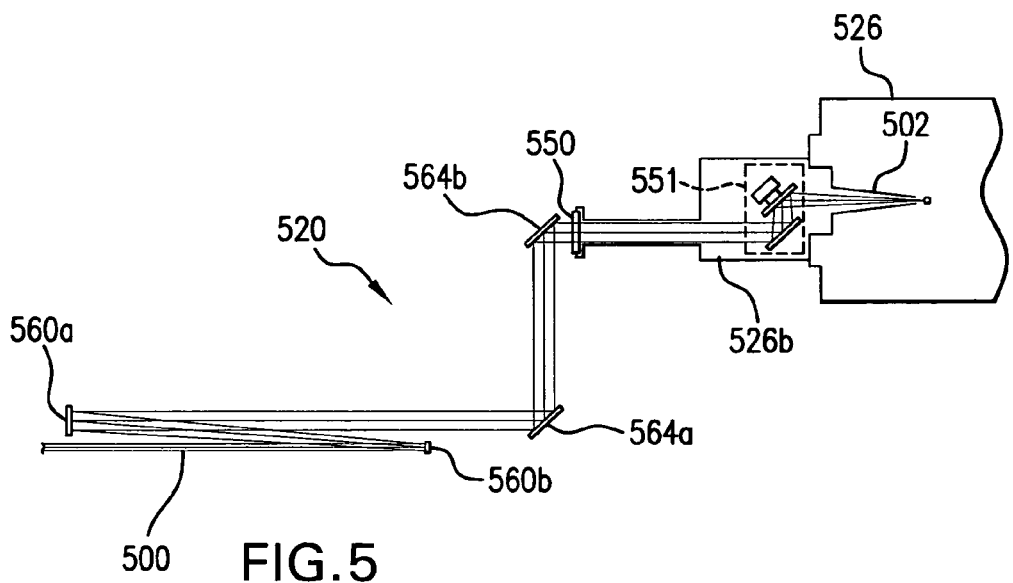
FIG. 5 shows a schematic, sectional view of another aspect of an embodiment wherein a beam delivery system is provided to deliver a laser beam into an EUV plasma chamber, the beam delivery system including a focusing optic, a steering optic, and an optical assembly to adjust focal power.

FIG. 5 shows an embodiment of a light source 520 that is similar to the light source 420 having a multi-compartment plasma chamber 526, conical shroud 502, a laser input window 550, a focus and steering assembly 551 disposed in the compartment 526a of the chamber 526, an optical assembly, e.g. z-fold telescope, having two spherical mirrors 560a,b that are disposed outside the chamber 526 to adjust focal power, and two turning mirrors 564a,b are provided to direct the light beam 500 from the z-fold telescope arrangement to the focusing mirror 552. With the arrangement shown in FIG. 5, both turning mirrors 564a,b are disposed outside the chamber 526, and are thus not exposed to plasma-generated debris and/or elevated temperatures/etchant.

As indicated above, the optical components in the focus and steering assembly 451/551 and mirrors 460a,b/560a,b of the focal power adjustment assembly may be moveable to adjust the position and focal power of the focal spot in the chamber 426/526. Adjustments to the focus and steering assembly and/or the focal power adjustment assembly may be made during light source setup and maintained at constant settings during operational use, or, adjustments to the focus and steering assembly and/or the focal power adjustment assembly may be made during light source operational use (i.e. during utilization of EUV light by a downstream apparatus, e.g. lithography scanner), for example, on a pulse by pulse basis and/or after a so-called "burst" of pulses, when a pulsed laser source 22 (see FIG. 1) is used. Adjustments to the focus and steering assembly and/or the focal power adjustment assembly may be made manually (e.g. during setup) or by a controller system 60 (see FIG. 1). For this purpose, inputs to the controller system 60 may include, but are not limited to, signals from the EUV light source detector 100 and/or the target position detection feedback system 62 (see FIG. 1).

Figure 6:
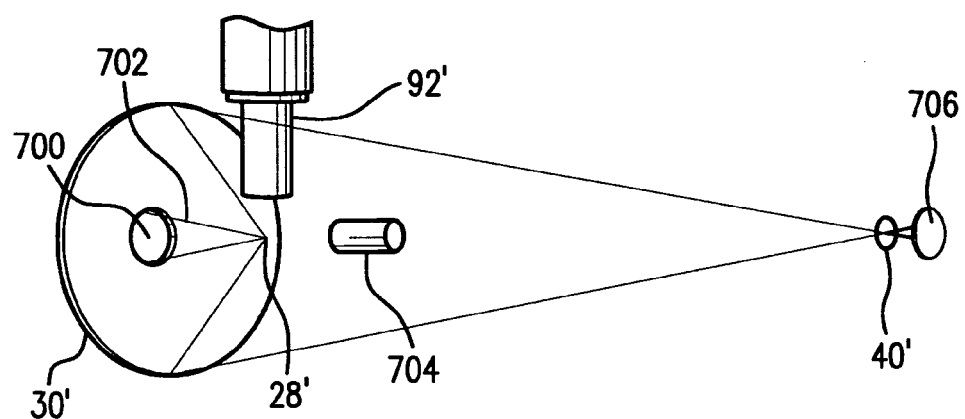
FIG. 6 shows a schematic, perspective view of portions of an EUV light source embodiment showing a fluorescent converter for measuring EUV light output.

FIG. 6 shows portions of an EUV light source embodiment having a collector 30', e.g., multilayer Mo/Si reflector, e.g., in the form of a truncated ellipse, with an aperture 700 to allow the laser light 702 to pass through and reach the irradiation site 28' and then pass to a beam stop 704. For the embodiment shown, the elliptical collector 30' is positioned to have a first focus at an irradiation site 28' and a second focus at a so-called intermediate point 40' (also called the intermediate focus 40') where the EUV light may be output from the light source and input to, e.g., an integrated circuit lithography tool (not shown). As shown, source material from a target delivery mechanism 92', e.g. source material droplet generator, may reach the irradiation site 28' for interaction with the laser beam to produce an EUV emission.

As further shown, a detector 706, which may be a fluorescent converter such as a Zr coated Ce:YAG fluorescent converter may be positioned at or near the intermediate focus 40', e.g. downstream of the intermediate focus 40', as shown, to measuring in-band EUV light output intensity and producing an output signal indicative thereof. For the embodiment shown, the detector 706 may be periodically interposed within the EUV output beam, e.g. temporarily taking the light source "off line" or may sample a portion of the EUV light output, for example, using a pick-off type beam splitter (not shown). Although a fluorescent converter is shown, it is to be appreciated that other types of detectors known to those skilled in the art may be used to measure EUV output intensity, in-band or otherwise, as described herein.

Figure 7:
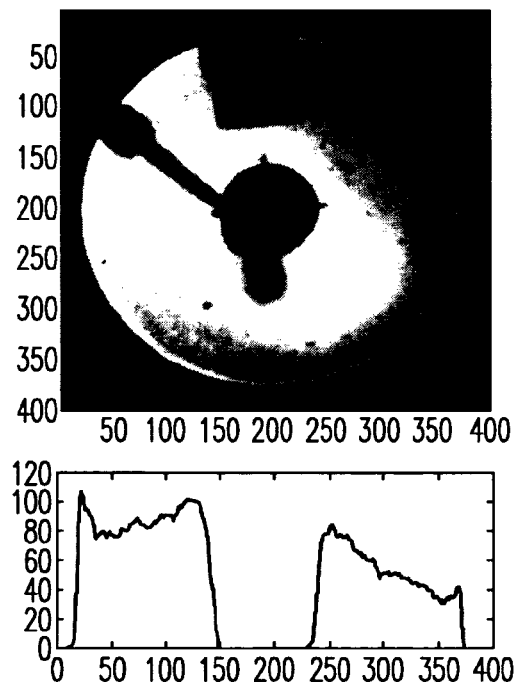
FIG. 7 shows a fluorescent converter image and corresponding intensity plot for an EUV output pulse generated by a laser—droplet interaction in which the laser is off-center relative to the droplet.

FIG. 7 shows an example of a fluorescent converter image (note: light areas indicate in-band EUV) and a corresponding intensity plot showing intensity as a function of distance across the detector. For the image and plot shown in FIG. 7, it can be seen that the angular emission distribution of EUV light is not symmetric and centered. Instead, as best seen in the FIG. 7 plot, in-band EUV intensity is stronger on the left side of the detector. This corresponds an EUV output pulse generated by a laser—droplet interaction in which the laser is off-center relative to the droplet.

Figure 8:
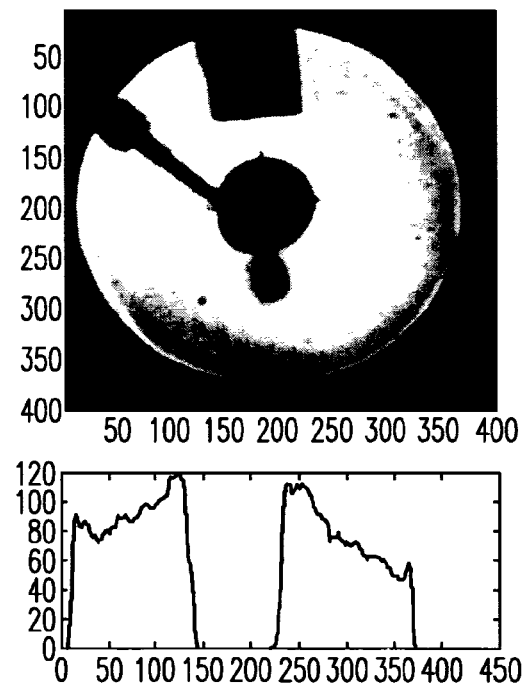
FIG. 8 shows a fluorescent converter image and corresponding intensity plot for an EUV output pulse generated by a laser—droplet interaction in which the laser is centered relative to the droplet.

FIG. 8 shows an example of a fluorescent converter image (note: light areas indicate in-band EUV) and a corresponding intensity plot showing intensity as a function of distance across the detector. For the image and plot shown in FIG. 8, it can be seen that the angular emission distribution of EUV light is substantially symmetric and centered about the input laser axis. Indeed, as best seen in the FIG. 8 plot, in-band EUV intensity is somewhat balanced on the left and right sides of the detector. This corresponds an EUV output pulse generated by a laser—droplet interaction in which the laser is substantially centered relative to the droplet.

Output signals from the detector 706 may be used to provide a more accurate coupling between the input laser and source material droplet. In particular, output signals from the detector 706 may be used to make adjustments to the focus and steering assembly and/or the focal power adjustment assembly described above or to the target delivery control mechanism 92' to provide a laser—droplet interaction in which the laser is substantially centered relative to the droplet. This procedure may be performed during light source setup and maintained at constant settings during operational use, or, adjustments to the focus and steering assembly, the focal power adjustment assembly and/or the target delivery control mechanism 92' may be made during light source operational use (i.e. during utilization of EUV light by a downstream apparatus, e.g. lithography scanner), for example, on a pulse by pulse basis and/or after a so-called "burst" of pulses, when a pulsed laser source 22 (see FIG. 1) is used.

Referring back to FIG. 1, a light source 20 is shown that produces EUV light by plasma formation and generates debris and may include a plasma chamber 26, a laser source 22, which may be a $CO_2$ gas discharge laser producing a laser beam having a wavelength, $\lambda$, e.g. about 10.6 µm, and a laser input window 56 for the plasma chamber. As further shown, the light source may include an etchant source 102, e.g. HBr, HI, $Br_2$, $Cl_2$, HCl, $H_2$ or a combination thereof, for the plasma formation material, e.g. Sn, into the plasma chamber and a heater 104 may be provided for heating deposited plasma formation material on the window 56 to an elevated temperature, t, e.g., a temperature greater than about 150° C., to increase a rate of a chemical reaction between deposited plasma formation material and the etchant. For this environment, a standard $CO_2$ laser window made of ZnSe may not be chemically stable when exposed to one or more of the etchants described above and/or elevated temperature. As a consequence, the light source 20 may employ a window 56 that is made of a material such as KBr, CsBr or CsI. These materials are substantially transparent to light at a wavelength of about 10.6 µm, and may be chemically stable when exposed to one or more of the above-described etchants at elevated temperatures. For example, KBr can be used with Hbr as the etchant and CsI can be used if HI is the etchant. Other combinations may also be suitable depending on etchant concentration and temperature. Alternatively, the window 56 may be made by coating a material such as ZnSe on the surface exposed to the plasma chamber interior with KBr, CsBr or CsI. For example, a KBr coating can be used with Hbr as the etchant and a CsI coating can be used if HI is the etchant. Other combinations may also be suitable depending on etchant concentration and temperature. Since KBr is highly hydroscopic, caution may need to be taken to avoid exposure to room air for prolonged periods of time. An in-situ heater may be provided when using a KBr chamber window to reduce absorbed moisture. The side of the window 56 that is not exposed to the etchant may be coated with a protection coating, so it is not sensitive to moisture.

Another technique which, may be employed to reduce moisture absorption involves in-situ coating a ZnSe window with KBr, CsBr or CsI after the window is installed in the vacuum chamber and the air is pumped out. FIG. 1 shows that a sputter gun 110, e.g. RF magnetron gun, may be disposed inside the chamber 26 to deposit a coating of KBr, CsBr or CsI on the window 56. In one implementation (not shown), the chamber window may be oriented at Brewsters angle relative to the incident laser bean to reduce losses due to reflectivity. For the implementation, Brewsters angle may be calculated with the refractive index of the KBr, CsBr or CsI coating layer that is deposited on the chamber window (for example, the refractive index of KBr is close to 1.52 at 10.6 microns). Alternatively, other methods of in-situ coating a window with a KBr, CsBr or CsI film can be used, such as CVD.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. While the particular aspects of embodiment(s) described and illustrated in this patent application in the detail required to satisfy 35 U.S.C. §112 are fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present invention is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

We claim:

1. An EUV light source comprising;
   a laser source;
   a plasma chamber; and
   a beam delivery system having at least one auxiliary chamber, said auxiliary chamber having an input window for passing a laser beam from the laser source into the auxiliary chamber and an exit window for passing the laser beam into said plasma chamber.

2. An EUV light source as recited in claim 1 wherein said laser source comprises a $CO_2$ laser.

3. An EUV light source as recited in claim 1 further comprising a bypass line establishing fluid communication between said plasma chamber and said auxiliary chamber.

4. An EUV light source as recited in claim 3 wherein said bypass line has a valve operable to close said bypass line.

5. An EUV light source as recited in claim 1 further comprising a focusing optic disposed in said auxiliary chamber for focusing said laser beam to a focal spot in said plasma chamber.

6. An EUV light source as recited in claim 5 wherein said focusing optic is a mirror.

7. An EUV light source as recited in claim 1 further comprising a focusing optic disposed in said plasma chamber for focusing said laser beam to a focal spot in said plasma chamber.

8. An EUV light source as recited in claim 7 wherein said focusing optic is a mirror.

9. An EUV light source as recited in claim 7 wherein said mirror is an off-axis parabolic mirror.

10. An EUV light source as recited in claim 6 wherein said focusing optic is moveable to selectively move the focal spot.

11. An EUV light source as recited in claim 10 further comprising a target delivery system for delivering a plasma source material to a plasma formation site in the plasma chamber.

12. An EUV light source as recited in claim 11 wherein said target delivery system comprises a droplet generator.

13. An EUV light source as recited in claim 11 further comprising a target position detector for generating a signal indicative of target position.

14. An EUV light source as recited in claim 13 wherein said focusing optic is moveable in response to said signal from said target position detector to locate the focal spot along a target trajectory.

15. An EUV light source as recited in claim 13 further comprising a steering optic disposed in said plasma chamber for steering the laser beam focal spot in said plasma chamber.

16. An EUV light source as recited in claim 15 wherein said steering optic comprises a flat mirror.

17. An EUV light source as recited in claim 15 wherein said steering optic and said focusing optic are moveable together in a first direction to move the focal spot along a path parallel to the first direction.

18. An EUV light source as recited in claim 15 wherein said steering optic is independently moveable in two dimensions.

19. An EUV light source as recited in claim 18 wherein said steering optic comprises a flat mirror and a tip-tilt actuator.

20. An EUV light source as recited in claim 15 wherein said steering optic is moveable in response to said signal from said target position detector to locate the focal spot along a target trajectory.

21. An EUV light source as recited in claim 1 further comprising a steering optic disposed in said plasma chamber for steering the laser beam in said plasma chamber.

22. An EUV light source as recited in claim 21 wherein said steering optic is independently moveable in two dimensions.

23. An EUV light source as recited in claim 21 wherein said steering optic comprises a flat mirror and a tip-tilt actuator.

24. An EUV light source as recited in claim 1 further comprising an optical assembly to adjust focal power.

25. An EUV light source as recited in claim 24 wherein said optical assembly comprises a z-fold telescope.

26. An EUV light source as recited in claim 25 wherein said z-fold telescope comprises two spherical mirrors.

27. An EUV light source as recited in claim 1 further comprising a focusing optic disposed in said plasma chamber for focusing said laser beam to a focal spot in said plasma chamber, a steering optic disposed in said plasma chamber for steering the laser beam focal spot in said plasma chamber and an optical assembly to adjust focal power.

28. An EUV light source as recited in claim 27 wherein said focusing optic comprises an off-axis parabolic mirror, said steering optic comprises a flat mirror coupled to a tip-tilt actuator and said optical assembly comprises a z-fold telescope.

29. An EUV light source as recited in claim 1 wherein a plasma is created in the plasma chamber comprising a plasma formation material, an etchant for the plasma formation material is introduced into the plasma chamber, and the light source further comprises a subsystem heating deposited plasma formation material on the exit window to a temperature greater than 150° C. to increase a rate of a chemical reaction between deposited plasma formation material and the etchant.

30. An EUV light source as recited in claim 29 wherein the plasma formation material comprises Sn.

31. An EUV light source as recited in claim 29 wherein the etchant is selected from the group of etchants consisting of HBr, HI, $Br_2$, $Cl_2$, HCl, $H_2$ and combinations thereof.

32. An EUV light source as recited in claim 1 wherein said laser source comprises a discharge laser having a discharge chamber operating at a discharge pressure and said light source further comprises a bypass line establishing fluid communication between said discharge chamber and said auxiliary chamber.

33. An EUV light source as recited in claim 32 wherein said bypass line has a valve operable to close said bypass line.

34. An EUV light source as recited in claim 1 further comprising a focusing optic disposed in said auxiliary chamber for focusing said laser beam to a focal spot in said plasma chamber.

35. An EUV light source as recited in claim 34 wherein said focusing optic is a mirror.

36. An EUV light source as recited in claim 32 wherein said laser source comprises a $CO_2$ laser.

37. An EUV light source as recited in claim 32 wherein said auxiliary chamber comprises:
   a first compartment;
   a second compartment; and
   a sealing assembly for reconfiguring said auxiliary chamber between a first configuration wherein said first compartment is in fluid communication with said second compartment and a second configuration wherein said first compartment is sealed from said second compartment.

38. An EUV light source as recited in claim 37 wherein said sealing assembly comprises a window disposed in said auxiliary chamber and moveable between a first position wherein said first compartment is in fluid communication with said second compartment and a second position wherein said first compartment is sealed from said second compartment.

39. An EUV light source as recited in claim 1 wherein said focusing optic is moveable to selectively move the focal spot.

40. An EUV light source as recited in claim 39 further comprising a target delivery system for delivering a plasma source material to a plasma formation site in the plasma chamber, a target position detector for generating a signal indicative of target position and wherein said focusing optic is moveable in response to said signal from said target position detector to locate the focal spot along a target trajectory.

41. An EUV light source as recited in claim 40 further comprising a steering optic disposed in said plasma chamber for steering the laser beam focal spot in said plasma chamber.

42. An EUV light source as recited in claim 41 wherein said steering optic and said focusing optic are moveable together in a first direction to move the focal spot along a path parallel to the first direction.

43. An EUV light source as recited in claim 42 wherein said steering optic comprises a flat mirror and is independently moveable in two dimensions by a tip-tilt actuator in response to said signal from said target position detector to locate the focal spot along a target trajectory.

44. A light source producing EUV by plasma formation of a material, said light source generating debris by plasma formation, said light source comprising:
   a plasma chamber;
   a $CO_2$ laser source producing a laser beam having a wavelength, $\lambda$;
   a laser input window for said plasma chamber,
   a source for introducing an etchant for the plasma formation material into the plasma chamber,
   a subsystem heating deposited plasma formation material on the window to an elevated temperature, t, to increase a rate of a chemical reaction between deposited plasma formation material and the etchant; and
   wherein said window is substantially transparent to said wavelength, $\lambda$, and said window has a surface, said surface being chemically stable when exposed to said etchant at said temperature, t.

45. A light source as recited in claim 44 wherein said window comprises a material selected from the group of materials consisting of KBr, CsBr and CsI.

46. A light source as recited in claim 44 wherein said window comprises a material coated with a material selected from the group of materials consisting of KBr, CsBr and CsI.

47. A light source as recited in claim 44 wherein said light source comprises a coating system to coat the window with a material selected from the group of materials consisting of KBr, CsBr and CsI after the window is installed in the plasma chamber.

48. A light source as recited in claim 45 wherein the plasma formation material comprises Sn and the etchant is selected from the group of etchants consisting of HBr, HI, $Br_2$, $Cl_2$, HCl, $H_2$ and combinations thereof.

49. A light source as recited in claim 45 wherein said wavelength, $\lambda$, is about 10.6 µm.

50. A light source as recited in claim 45 wherein said temperature, t, is greater than 150° C.

* * * * *